(12) United States Patent
Chen

(10) Patent No.: US 8,618,601 B2
(45) Date of Patent: Dec. 31, 2013

(54) SHIELDED GATE TRENCH MOSFET WITH INCREASED SOURCE-METAL CONTACT

(75) Inventor: John Chen, Palo Alto, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 0 days.

(21) Appl. No.: 13/016,804

(22) Filed: Jan. 28, 2011

(65) Prior Publication Data

US 2011/0133258 A1 Jun. 9, 2011

Related U.S. Application Data

(63) Continuation-in-part of application No. 12/583,192, filed on Aug. 14, 2009, now Pat. No. 8,236,651.

(51) Int. Cl.
*H01L 29/66* (2006.01)

(52) U.S. Cl.
USPC ............... 257/330; 257/332; 257/E21.419; 257/E29.201; 257/E29.262

(58) Field of Classification Search
USPC ............... 257/330, 332, E21.419, E29.201, 257/E29.262
See application file for complete search history.

(56) References Cited

U.S. PATENT DOCUMENTS

| | | |
|---|---|---|
| 5,434,435 A | 7/1995 | Baliga |
| 5,998,833 A | 12/1999 | Baliga |
| 6,690,062 B2 | 2/2004 | Henninger et al. |
| 6,750,116 B1 | 6/2004 | Chen |
| 7,102,182 B2 * | 9/2006 | Takemori et al. ............ 257/271 |
| 7,449,354 B2 | 11/2008 | Marchant et al. |
| 7,470,588 B2 | 12/2008 | Cho et al. |
| 7,473,603 B2 | 1/2009 | Kraft et al. |
| 7,553,740 B2 * | 6/2009 | Sharp et al. .................... 438/424 |
| 7,576,388 B1 | 8/2009 | Wilson et al. |
| 7,936,009 B2 * | 5/2011 | Pan et al. ....................... 257/330 |
| 2004/0021174 A1 * | 2/2004 | Kobayashi ..................... 257/330 |
| 2004/0065919 A1 | 4/2004 | Wilson et al. |
| 2004/0169220 A1 * | 9/2004 | Takemori et al. ............. 257/330 |
| 2006/0273382 A1 | 12/2006 | Hshieh |
| 2007/0155104 A1 | 7/2007 | Marchant et al. |
| 2007/0158701 A1 | 7/2007 | Chang et al. |
| 2007/0187751 A1 | 8/2007 | Hu et al. |
| 2007/0194374 A1 | 8/2007 | Bhalla et al. |
| 2008/0067584 A1 | 3/2008 | Lui et al. |
| 2008/0121986 A1 | 5/2008 | Hshieh |
| 2008/0135931 A1 | 6/2008 | Challa et al. |
| 2008/0258213 A1 | 10/2008 | Yilmaz et al. |
| 2008/0265289 A1 | 10/2008 | Bhalla et al. |
| 2009/0014768 A1 | 1/2009 | Lin et al. |
| 2009/0072301 A1 | 3/2009 | Bhalla et al. |
| 2009/0085074 A1 | 4/2009 | Su et al. |
| 2009/0111231 A1 | 4/2009 | Grebs et al. |
| 2009/0114968 A1 | 5/2009 | Wang et al. |
| 2010/0052044 A1 | 3/2010 | Hirler |
| 2010/0065904 A1 * | 3/2010 | Pan et al. ....................... 257/330 |

* cited by examiner

*Primary Examiner* — Julia Slutsker
(74) *Attorney, Agent, or Firm* — Van Pelt, Yi & James LLP

(57) ABSTRACT

A semiconductor device formed on a semiconductor substrate having a substrate top surface, includes: a gate trench extending from the substrate top surface into the semiconductor substrate; a gate electrode in the gate trench; a dielectric material disposed over the gate electrode; a body region adjacent to the gate trench; a source region embedded in the body region, at least a portion of the source region extending above the dielectric material; a contact trench that allows contact such as electrical contact between the source region and the body region; and a metal layer disposed over at least a portion of a gate trench opening, at least a portion of the source region, and at least a portion of the contact trench.

12 Claims, 12 Drawing Sheets

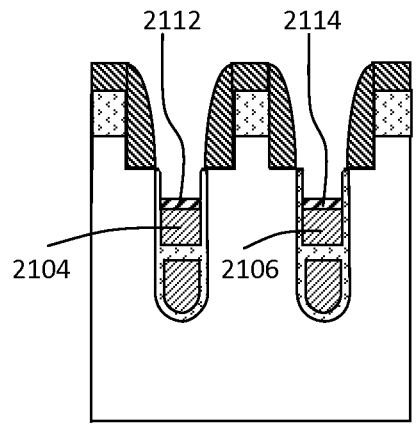
Fig. 17
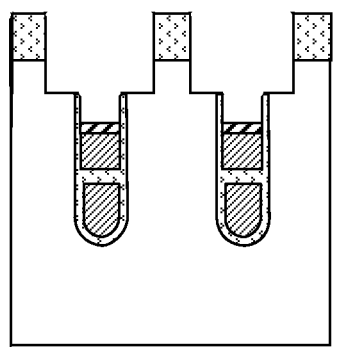   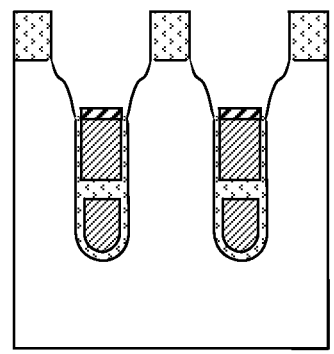
Fig. 18A                Fig. 18B
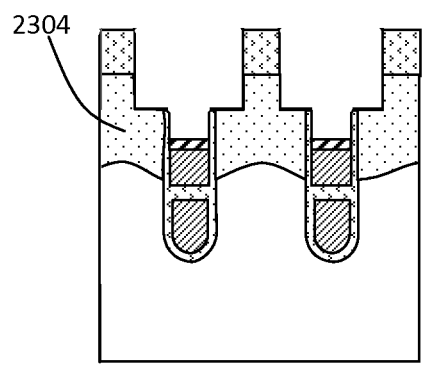   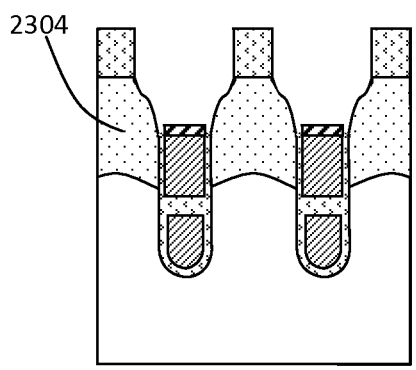
Fig. 19A                Fig. 19B

SHIELDED GATE TRENCH MOSFET WITH INCREASED SOURCE-METAL CONTACT

CROSS REFERENCE TO OTHER APPLICATIONS

This application is a continuation in part of co-pending U.S. patent application Ser. No. 12/583,192 entitled SHIELDED GATE TRENCH MOSFET DEVICE AND FABRICATION filed Aug. 14, 2009, which is incorporated herein by reference for all purposes.

BACKGROUND OF THE INVENTION

Many electronic circuit designs today have strict requirements on device performance parameters such as switching performance and on-state resistance. Power MOS devices are often used in such circuits. Shielded gate trench Metal Oxide Semiconductor Field Effect Transistors (MOSFETs) is a type of power MOS device that has good high frequency switching performance and low on-state resistance. Existing fabrication techniques for shielded gate MOSFETs are typically complex and expensive, usually requiring 6 or more masks to be applied during processing. The existing techniques also tend to have significant defect rate. The resulting devices often have relatively high contact resistance and unstable transient behavior.

BRIEF DESCRIPTION OF THE DRAWINGS

Various embodiments of the invention are disclosed in the following detailed description and the accompanying drawings.

FIGS. 2-26C are process diagrams illustrating embodiments of device fabrication processes.

DETAILED DESCRIPTION

The invention can be implemented in numerous ways, including as a process; an apparatus; a system; a composition of matter. In some embodiments, the invention may be controlled by a computer program product embodied on a computer readable storage medium, and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Embodiments of shielded gate MOSFET devices and fabrication process are disclosed. The fabrication process employs a self aligned contact scheme using nitride spacers. The resulting shielded gate MOSFET devices have recessed gate dielectric, which allows for greater source-metal contact areas and less contact resistance. The devices are more reliable and exhibit more stable transient response.

Figure 1:
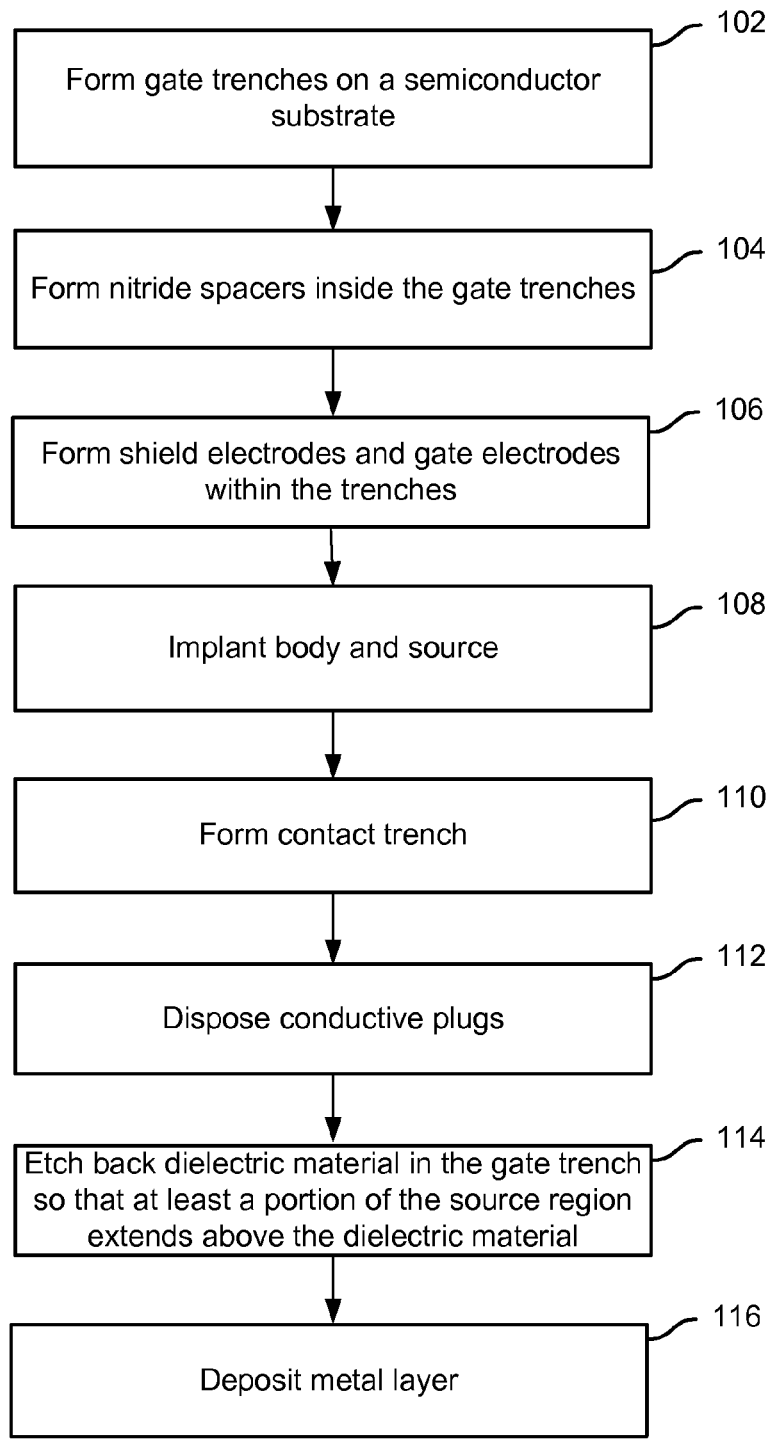
FIG. 1 is a flowchart illustrating an embodiment of a shielded gate MOSFET fabrication process.

FIG. 1 is a flowchart illustrating an embodiment of a shielded gate MOSFET fabrication process. At 102, one or more gate trench openings are at least partially formed on a semiconductor substrate. At 104, nitride spacers are formed on the inside of the gate trench openings. The gate trenches may be etched to be aligned to the nitride spacers. During subsequent processing steps, the spacers block the substrate from being etched, allowing self-aligned contact trench formation. At 106, shield electrodes and gate electrodes are formed within the trenches. Dielectric material fills at least a part of the trenches and separates the shield electrodes from the gate electrodes. The shield electrodes shield the gate electrodes from high voltages. At 108, dopants for forming body and source regions are implanted in the substrate. At 110, contact trenches are formed in a self-aligned manner without requiring any additional mask. At 112, conductive plugs are disposed within the contact trenches. At 114, the dielectric material in the gate trench is etched back so that at least a portion of the source region extends above the dielectric material. At 116, a metal layer is deposited over at least a portion of a gate trench opening, at least a portion of the source region, and at least a portion of the contact trench. The metal layer is patterned into source and gate metal. In some embodiments, the source metal, which may include a top metal layer and one or more contact trench plugs, makes contact with a source region on multiple sides, thereby reducing contact resistance and making the device more reliable.

FIGS. 2-26 are process diagrams illustrating embodiments of device fabrication processes. In the following discussion, an N type device is described for purposes of illustration. P type devices may be fabricated using a similar process.

FIGS. 2-5 depict initial steps in the formation of the gate trenches.

Figure 2:
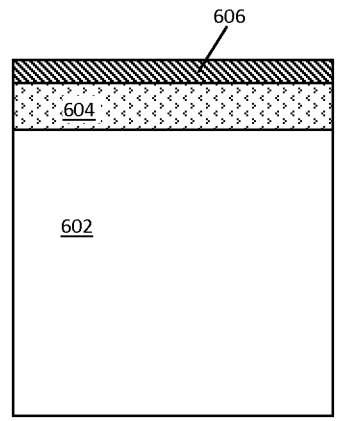

In FIG. 2, an N type substrate 602 is used as the drain of the device. In this example, the N type substrate is an $N^+$ silicon wafer with an $N^-$ epi layer grown on the wafer surface. In some embodiments, Epi doping concentration is approximately 3E16-1E17 dopants/$cm^3$, with thickness of 2-4 um, and substrate resistivity of 0.5-3 mohm*cm.

A silicon oxide layer 604 is formed on the substrate by deposition or thermal oxidation. A nitride layer 606 is disposed on top of the silicon oxide layer. In some embodiments, the thickness of the silicon oxide layer is approximately 500~1500 Å, and the thickness of the nitride layer is approximately 1500 Å.

A photo resist (PR) layer is then applied on top of the nitride layer and patterned using a first mask (also referred to as the trench mask). In the following discussion, for purposes of illustration, it is assumed that positive PR is used, thus the unexposed areas are kept and the exposed areas are removed. Negative PR may also be used, and the mask would be modified accordingly. The mask defines active gate trenches. The mask may also define other trenches such as source poly pickup trenches and gate runner/termination trenches, which are not shown in the diagrams. The width of the active trenches is approximately 0.6 um in some embodiments. Low grade masks such as masks with critical dimension of 0.35 um can be used to fabricate the device therefore reduce the cost of masks required.

Figure 3:
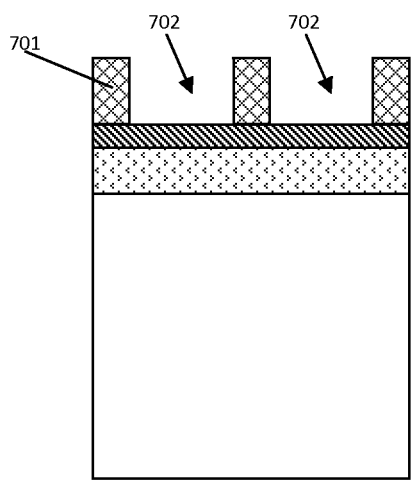

In FIG. 3, the residual PR layer 701 defines active gate trench openings 702. Additional trenches such as source poly pickup trenches and gate runner/termination trenches may be formed in some embodiments but are not shown in the diagram.

Figure 4:
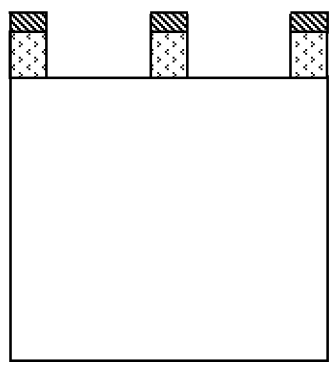

Next, a hard mask (HM) etch is performed to etch away exposed portions of the nitride layer and silicon oxide layer. The etching stops at the silicon surface. The remaining PR is then removed. In FIG. 4, trench openings are formed in exposed areas while a hard mask is formed by the remaining nitride-oxide portions.

Figure 5A:
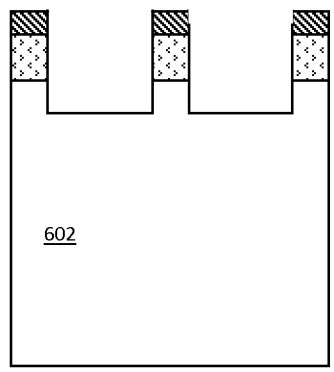
Figure 5B:
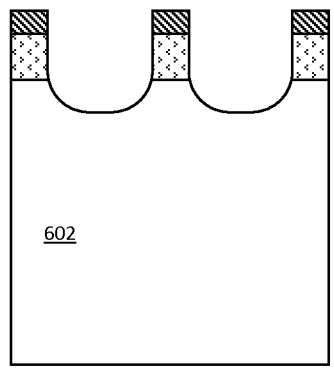

A trench etch follows, etching into the semiconductor material 602 at the trench openings. Depending on the etching method, the trench walls may be substantially straight (as shown in FIG. 5A) or curved (as shown in FIG. 5B). In some embodiments, the target depth of the trenches is approximately 0.3 um~0.5 um.

Figure 6:
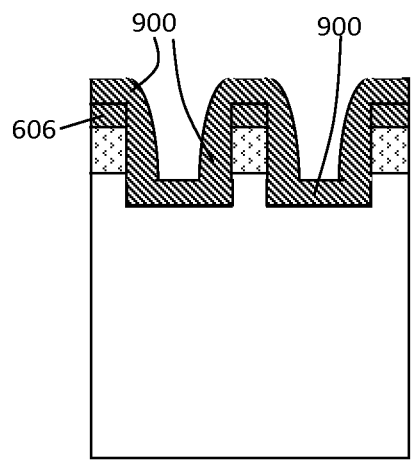

A thin layer of oxide is deposited or grown thermally in the trench openings, lining both the trench bottom and the trench walls. The oxide layer is approximately 200 Å thick in some embodiments. Once the oxide is formed, an additional layer of nitride 900 is deposited. Only a thin layer of oxide is needed under the nitride so it is not separately drawn in the figure. In some embodiments, the thickness of the additional nitride layer is approximately 1500 Å-2200 Å. In some embodiments, the nitride layer has a thickness of approximately 1500 Å. As shown in FIG. 6, the nitride layer 900 lines the trench and covers the rest of the exposed areas.

Figure 7:
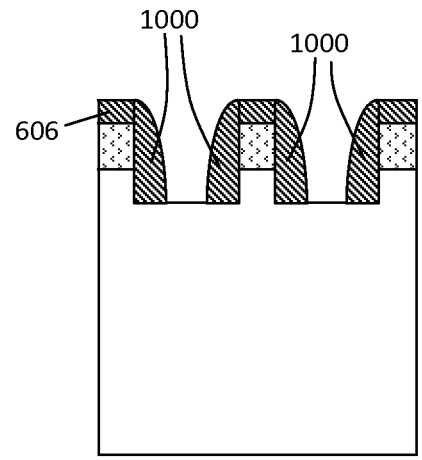

Nitride spacers such as 1000 are formed along the trench walls after blanket anisotropic etch back, as shown in FIG. 7. Portions of the original nitride layer 606 also remain.

Figure 8:
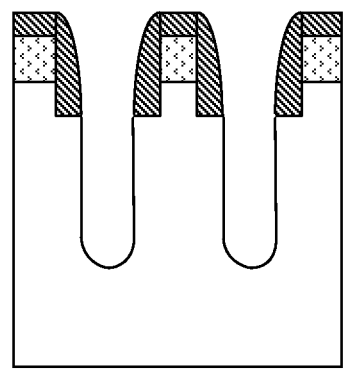

Next, any exposed liner oxide layer in the bottom of the trench opening is removed and a blanket silicon etch step is performed to further deepen the trenches in FIG. 8 between the nitride spacers. The resulting trench depth is on the order of approximately 1.5 um~2.5 um depending on device application, and the trench walls are sloped at an angle of approximately 87°~88°. The nitride spacers allow for a self-aligned etching step that does not require additional alignment steps such as an additional alignment mask, thus achieving trench slope etch. The depth of the trenches may range from a few hundred angstroms to a few microns. Round hole (R/H) etch ranging from 250 Å~500 Å is performed to make the corners of the trenches smoother to prevent high electric fields due to sharp corners.

Figure 9:
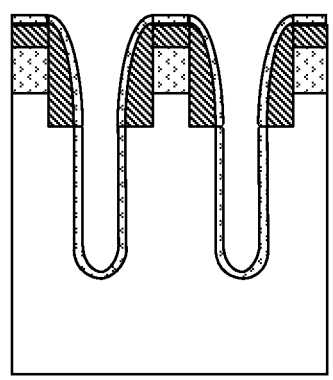

In FIG. 9, one or more oxide layers are deposited or thermally grown. In some embodiments, a sacrificial oxide layer of approximately 500 Å is optionally grown and removed to improve the silicon surface. By way of example, a layer of oxide of approximately 250 Å can be grown in the trenches, followed by depositing a layer of high temperature oxide (HTO) of approximately 900 Å.

Figure 10:
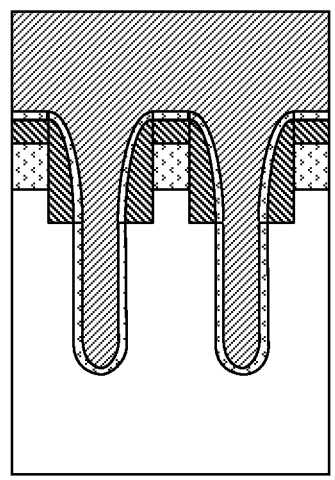

Polysilicon (poly) is disposed, as shown in FIG. 10. In some embodiments, the thickness of the poly is approximately 12000 Å, which is greater than half the width of the widest trench in the device (widest trench not shown). Thus, poly layers on the sidewalls merge and completely fill the trenches. This layer of poly is sometimes referred to as source poly, shield poly, or poly 1.

Figure 11:
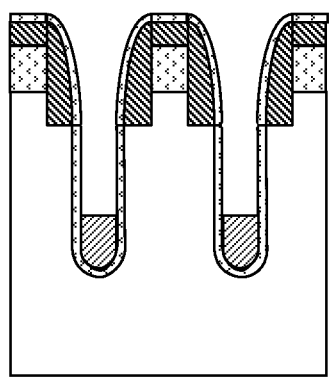

The source poly is then etched back using dry etch, as shown in FIG. 11. In this example, in the active gate trenches, the remaining poly has a thickness of approximately 6000 Å.

Figure 12:
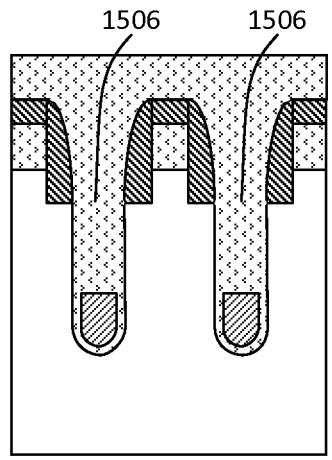

High density plasma (HDP) oxide 1506 is then deposited and densified. In some embodiments, the densification takes place at a temperature of approximately 1150° C. and lasts for approximately 30 seconds. As shown in FIG. 12, the thickness of the oxide layer 1506 is greater than half the width of the active trench (in some embodiments, the oxide layer has a thickness of approximately 2000 Å~4000 Å), thus completely filling the active trenches.

Figure 13:
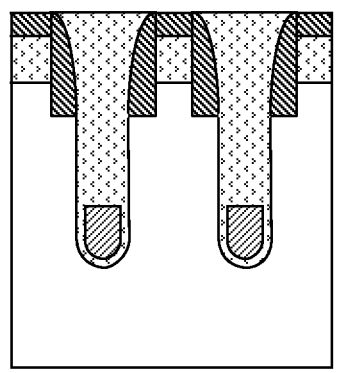

Oxide chemical mechanical polish (CMP) may be performed. As shown in FIG. 13, the CMP process is used to polish the oxide until the top surface of the oxide is even with the nitride surface, which serves as an etch stop.

Figure 14:
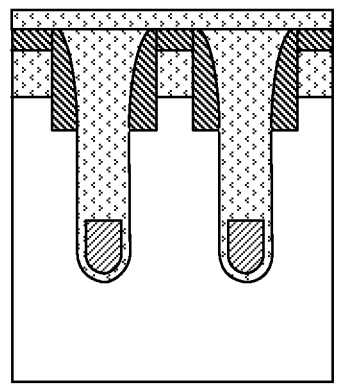

FIG. 14 show that another layer of oxide is added. The thickness of the oxide layer is approximately 1000 Å~2000 Å in some embodiments. The thickness of this oxide controls the degree of undercut of wet etching under the second mask. This oxide film also protects the nitride in all the non-active area of the device. The protected nitride allows maskless blanket etching of the Si later.

In some embodiments, a layer of photo resist is then spun on the surface of the structure and a second mask (also referred to as the poly cover mask) is applied to form a PR pattern. Areas covered by the PR (such as termination trenches not shown in the diagram) are protected from oxide wet etching. In the embodiment shown, the active trench area is not covered by PR and is subject to oxide wet etching.

Figure 15:
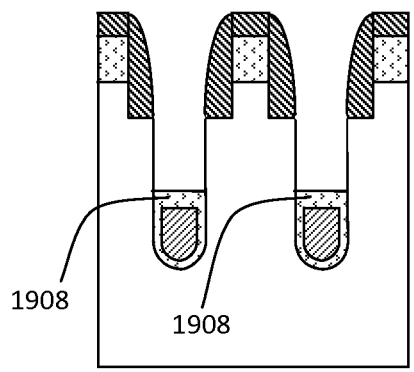
Figure 16:
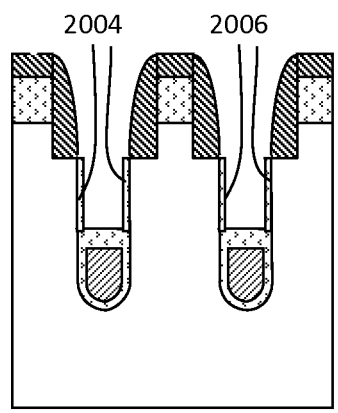

Wet etch is then performed. The result of the wet etch is shown in FIG. 15. Some oxide in areas unmasked by PR is removed, such that the remaining oxide is held at desired height. The oxide layer above the poly, such as oxide layer 1908, is referred to as inter-poly dielectric (IPD), which can range between a few hundred to a few thousand angstroms.

The steps described in FIGS. 13-15 are optional for an embodiment in which asymmetric oxide termination/gate runner trenches are formed. Alternatively, the oxide 1506 from FIG. 12 may be etched back directly to form the IPD 1908 shown in FIG. 15.

The PR, if used, is then removed, and a layer of gate oxide is disposed or thermally grown. In some embodiments, the added oxide layer is approximately 450 Å thick. Thus, in FIG. 16, active trench walls such as 2004 and 2006 are lined with gate oxide.

Another poly deposition and etch back is performed. The result is shown in FIG. 17. Poly is disposed to fill the trenches. In some embodiments, approximately 0.5-1 um of poly is disposed in the trenches. The disposed poly is etched back, forming gate poly such as 2104 and 2106. The top of the gate poly at least meets, and in some cases overlaps with the bottom of the source so that a channel can be formed. In some embodiments, the poly surface is approximately 500-5000 Å below the bottom of the nitride spacers. Optionally, a layer of metal such as titanium or cobalt may be deposited and annealed. Where the metal is in contact with the poly, a polycide layer is formed. The titanium or cobalt metal over the oxide or nitride does not form silicide/polycide and is removed. As shown, polycide is formed at 2112 and 2114 on top of gate poly electrodes 2104 and 2106.

In FIG. 18A, exposed nitride spacers adjacent to the active gate trenches as well as nitride layers atop the oxide hard mask are removed, e.g., through a wet etch process.

In some embodiments, the various preceding thermal steps (e.g., oxide deposition, HDP oxide densification) cause oxidization of the silicon in the interface region, and to a lesser degree oxidization of the nitride in the same region. The substrate surface underneath the nitride spacers changes due to the local oxidization of silicon (LOCOS) process and becomes curved. This phenomenon, referred to as the "bird's beak effect", is well known in the art. In addition, various preceding etching steps cause the nitride spacers to become eroded at certain regions, further exposing the nitride-silicon interface to oxidation. Accordingly, when the nitride spacers and other exposed nitride material are removed through the wet etch process, the remaining trench wall may have a curvature, as shown in FIG. 18B.

The body and the source of the device are implanted. No additional mask is required to implant the body and the source of the device. Specifically, in FIGS. 19A and 19B, body implant takes place. The device is bombarded with dopant ions with an angle. Certain areas of the device may be protected by nitride (not shown). In active areas unprotected by nitride, the implant forms body regions such as 2304. In some embodiments, Boron ions with a dosage level of approximately 1.8e13 at 60 KeV~180 KeV are used to form an N-channel device. Other types of ions can be used. For example, Phosphorous ions can be used for P-channel devices.

Figure 20A:
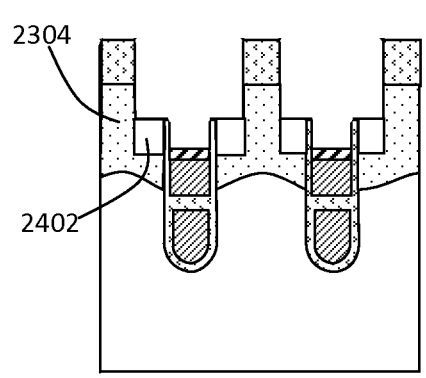
Figure 20B:
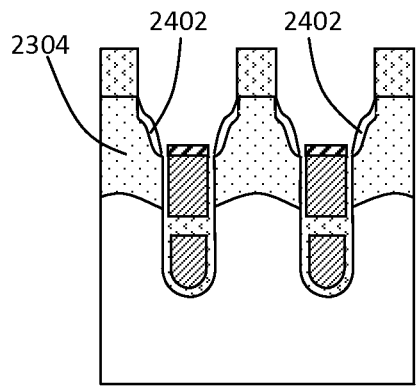

In FIGS. 20A and 20B, source implant takes place with a zero tilt angle. The device is again bombarded with dopant ions. In some embodiments, Arsenic ions with a dosage level of 4e15 at 40 KeV~80 KeV are used. Source regions such as 2402 are formed within body regions such as 2304. In FIG. 20B, surfaces of the source regions conform to the curved shape of the trench wall.

Figure 21A:
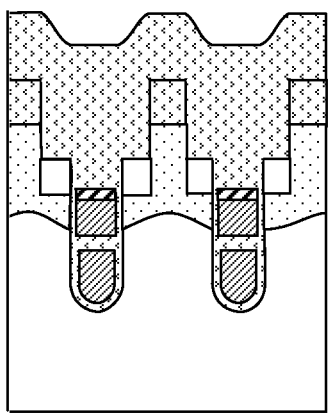
Figure 21B:
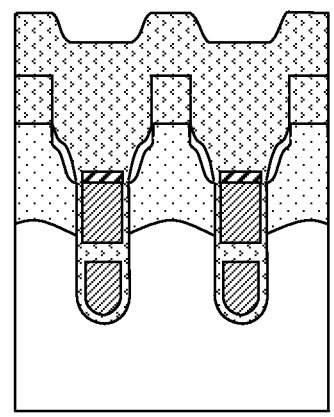

In FIGS. 21A and 21B, a dielectric layer, e.g. an oxide layer, is deposited to fill trench openings and separate source and gate poly regions. The thickness of the oxide layer ranges between 5000 Å~8000 Å in various embodiments. In some embodiments, a chemical vapor deposition (CVD) process is used to deposit Low Temperature Oxide (LTO) and Borophosphosilicate Glass (BPSG) to a thickness of approximately 5000 Å.

Figure 22A:
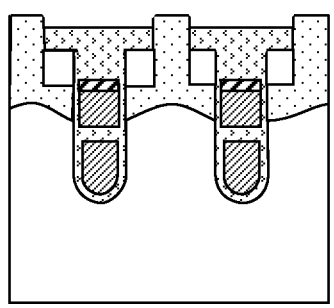
Figure 22B:
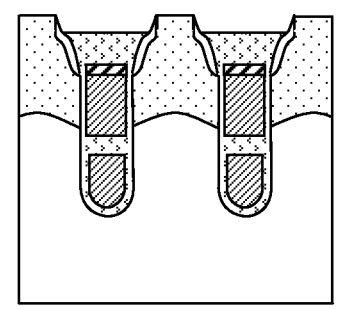

In FIGS. 22A and 22B, the oxide is etched back through a dry etch process. In this example, the oxide is etched down such that the resulting top surface of the oxide is below the substrate top surface by about 500 Å~1000 Å. The oxide hard mask formed in FIGS. 2-4 is also removed by this process.

Figure 22C:
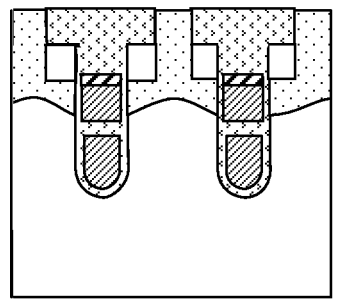

Alternatively, the oxide may be planarized (e.g., by a chemical mechanical polishing (CMP) process) such that the oxide top surface is even with the substrate top surface. FIG. 22C shows this alternative.

Figure 23A:
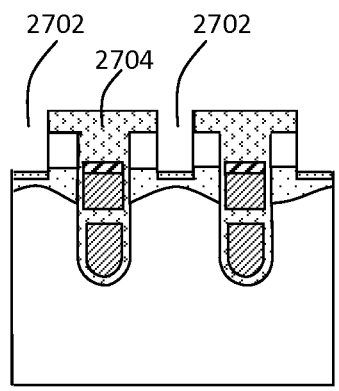
Figure 23B:
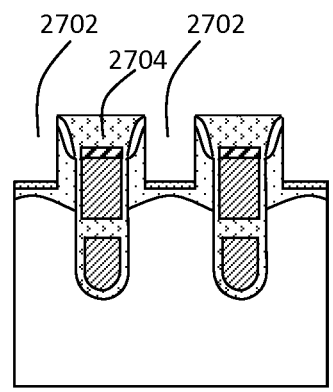

In FIGS. 23A and 23B, the substrate is etched to form contact trenches such as 2702. The etch depth ranges from 0.6 um~0.9 um depending on device applications. Exposed substrate areas are etched and areas protected by oxide are not etched. Since the etching process does not require an additional mask, it is referred to as a self-aligned contact process. In this case, the contact trenches are self-aligned to the remaining portion of the oxide 2704. Optionally, as shown in FIG. 23B, after etching the contact trenches, a heavily doped P+ body contact region may be formed (e.g., implanted) at the bottom of the contact trenches.

Figure 24A:
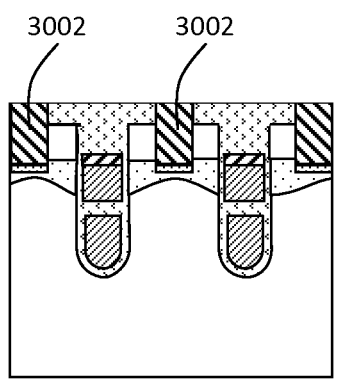
Figure 24B:
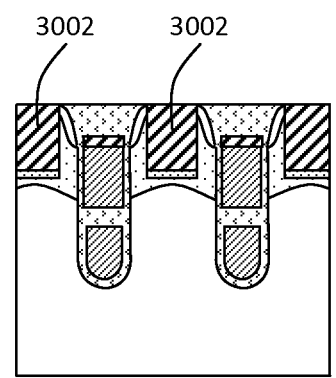

In FIGS. 24A and 24B, barrier metal (not specifically shown) such as Ti and TiN are optionally deposited, followed by RTP to form Ti silicide near the contact region. The thicknesses of Ti and TiN used in some embodiments are 300 Å and 1000 Å, respectively. A conductive plug material, e.g., tungsten (W), is then deposited. In some embodiments 4000 Å~6000 Å of W is deposited. The deposited W is etched back up to the substrate surface to form individual conductive (W) plugs such as 3002.

Figure 25A:
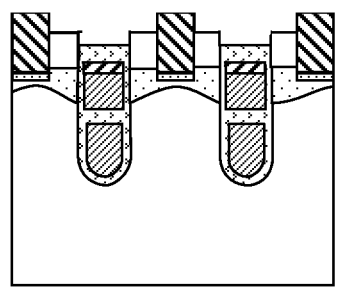
Figure 25B:
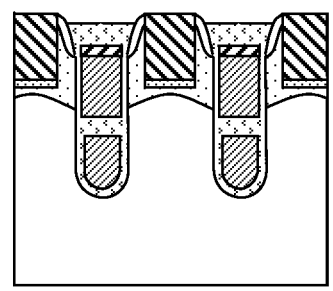

In FIGS. 25A and 25B, oxide etch takes place. The oxide layer is etched back. The etching process removes the layer of oxide over the source and the active gate trench opening, as well as a portion of the oxide layer within the gate trench, such that the remaining oxide layer inside the gate trench is recessed from the top surface of the source. In other words, the resulting oxide layer has a top surface that is lower than the top of the source. In some embodiments, the top of the oxide layer is approximately 500-1000 Å below the top of the source region. As will be seen later, the etching process exposes more source area for making source-metal contact.

Figure 24C:
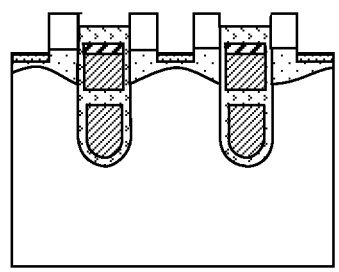
Figure 24D:
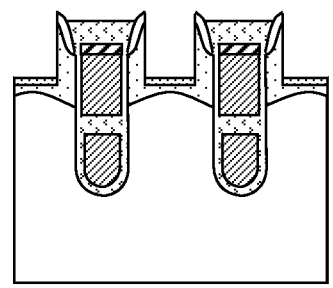

Alternatively, this oxide etchback step may take place after etching the contact trenches 2702 in FIGS. 23A and 23B, and before forming the conductive plugs 3002. In an alternative embodiment, FIGS. 24C and 24D show the oxide etchback step similar to that of FIGS. 25A and 25B, but taking place before forming the conductive plugs 3002. In the alternative embodiment, the conductive plugs are disposed following the formation of structures shown in FIGS. 24C and 24D to form the structures shown in FIGS. 25A and 25B.

Figure 26A:
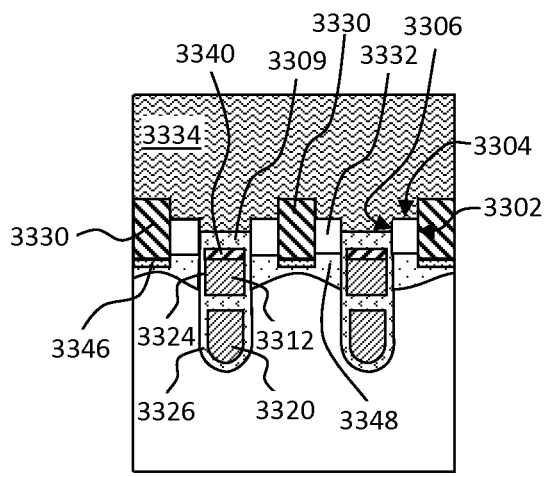
Figure 26B:
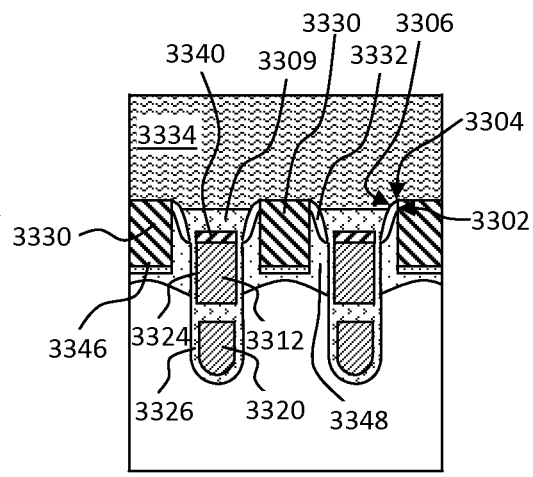

In FIGS. 26A and 26B, a metal layer is deposited. In some embodiments, AlCu is used to form a metal layer that is approximately 3 um~6 um thick. The metal is then annealed at 450° C. for approximately 30 minutes. In some embodiments, the metal is patterned to form source and gate metal, connecting to the source and gate regions via additional trenches (not shown in the diagram). The top of the final device is formed. Though not shown, a metal layer may be formed on the bottom of the substrate, typically after a back-grinding process.

In the resulting device, the active gate trenches each include a top poly electrode (e.g., poly 3312), also referred to as the gate poly or gate electrode since it function as the gate, or poly 2 since it is formed from the second poly deposition process during fabrication. Each top poly electrode further includes a polycide layer 3340 disposed on top surface of gate electrode to improve the conductivity along the gate. Each trench further includes a bottom poly electrode (e.g., poly 3320), also referred to as the source poly or source electrode since it is connected to the source, or poly 1 since it is formed from the first poly deposition process during fabrication, or shield poly or shield electrode since it shields the gate poly from high voltages. The gate poly is separated from the source poly by inter-poly dielectric regions formed by oxide. In the active gate trenches shown in this example, the oxide layer (e.g., oxide layer in region 3324) that surrounds the gate poly and lines the sidewalls of the top portion of the trench is thinner than the oxide layer (e.g. oxide layer 3326) surrounding the source/shield poly and lining the sidewalls of the bottom portion of the trench. In active area source metal 3334 is insulated from gate electrodes such as 3312 by a dielectric layer such as oxide 3309. Source metal layer 3334 electrically connects to source regions 3332 and body regions 3348 through a conductor 3330 such as Tungsten plug that fills the source body contact openings and extends from source metal into the body regions. Body contact implant regions 3346 improve the Ohmic contact between the body regions and the conductor 3330.

Figure 26C:
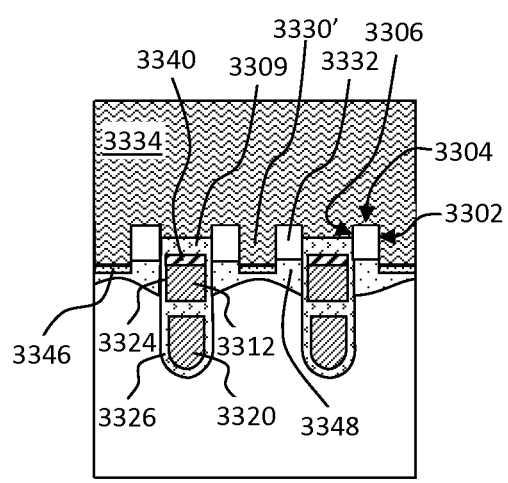

The above process yields a MOSFET device with increased source-metal contact areas. Specifically, because the source regions extend above the top surface of the gate oxide, a single source region has multiple surfaces (e.g. at surfaces 3302, 3304 and 3306) that are in contact with a top metal (e.g. source metal layer 3334 and conductive plug 3330). For example, the top metal makes contact to the source region on a source region surface 3302 facing the contact trench and on a source region surface 3306 facing the recessed oxide 3309, as well as on the source region top surface 3304. The recessed oxide 3309 over the gate region allows the metal to contact a sidewall 3306 of the source facing the recessed oxide. Increased source-metal contact areas lead to reduced contact resistance and more stable transient response. Also, the increased area means that it is less likely that the contact would be defective, thus resulting in more reliable devices and higher manufacturing yields. In some embodiments, the conductive plug 3330' comprises the same material as the source metal layer 3334, as shown in FIG. 26C. In this case, the conductive plug 3330' may be formed/filled at the same time as the rest of the source metal layer 3334.

The above examples mostly illustrate N-channel devices. The techniques described are also applicable to P-channel devices, in which polarities of various dopants are reversed.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A semiconductor device formed on a semiconductor substrate having a substrate top surface, comprising:
   a gate trench extending from the substrate top surface into the semiconductor substrate;
   a gate electrode in the gate trench;
   a gate top dielectric material disposed over the gate electrode;
   a body region adjacent to the gate trench;
   a source region embedded in the body region;
   a contact trench that allows contact between the source region and the body region; and
   a metal layer disposed over at least a portion of a gate trench opening, at least a portion of the source region, and at least a portion of the contact trench, wherein:
   the source region has a curved sidewall portion that is adjacent to the gate trench, and that extends above the gate top dielectric material.

2. The semiconductor device of claim 1, wherein the metal layer covers the gate top dielectric material over the gate electrode and contacts a sidewall of the source region facing the gate top dielectric material.

3. The semiconductor device of claim 1, further comprising a shield electrode formed within the gate trench, wherein the gate electrode and the shield electrode are separated by an inter-electrode dielectric material.

4. The semiconductor device of claim 1, wherein the source region has a substantially vertical surface, and at least a portion of the substantially vertical surface is in physical contact with the metal layer.

5. The semiconductor device of claim 1, wherein the gate trench has a trench wall that is at least in part curved.

6. The semiconductor device of claim 5, wherein the curved sidewall portion at least in part conforms to the curved portion of the trench wall.

7. The semiconductor device of claim 1, wherein the metal layer is in contact with the source region on a side of the source region facing the contact trench and on a side of the source region facing the gate top dielectric material.

8. The semiconductor device of claim 1, wherein the top surface of the gate top dielectric material is recessed below the top of the source region.

9. The semiconductor device of claim 1, wherein the curved sidewall portion has a convex curvature with respect to the source region.

10. The semiconductor device of claim 1, wherein the metal layer is in contact with the source region on multiple sides.

11. The semiconductor device of claim 1, wherein the contact trench is at least in part filled with a conductive plug.

12. The semiconductor device of claim 1, wherein the gate trench includes a portion that is substantially vertical with respect to the substrate top surface.

* * * * *